United States Patent [19]

Shimada et al.

[11] Patent Number: 5,383,984
[45] Date of Patent: Jan. 24, 1995

[54] PLASMA PROCESSING APPARATUS ETCHING TUNNEL-TYPE

[75] Inventors: Yutaka Shimada, Sagamihara; Hitoshi Kato, Kofu; Junichi Kakizaki, Fujisawa; Kazutugu Aoki, Shiroyama; Haruki Mori, Yokosuka; Tatsuo Shiotsuki, Ooita, all of Japan

[73] Assignees: Tokyo Electron Limited, Tokyo; Tokyo Electron Tohoku Limited, Esashi; Kabushiki Kaisha Toshiba, Kawasaki, all of Japan

[21] Appl. No.: 77,602

[22] Filed: Jun. 17, 1993

[30] Foreign Application Priority Data

Jun. 17, 1992 [JP] Japan .................................. 4-183216
Jun. 17, 1992 [JP] Japan .................................. 4-183217
Jun. 17, 1992 [JP] Japan .................................. 4-183218

[51] Int. Cl.$^6$ ............................................. H01L 21/00
[52] U.S. Cl. .................................. 156/345; 156/643; 118/723 ER; 118/725
[58] Field of Search ............. 118/723 E, 723 ER, 724, 118/725, 730; 156/345, 643

[56] References Cited

U.S. PATENT DOCUMENTS

| | | | |
|---|---|---|---|
| 4,786,352 | 11/1988 | Benzing | 156/345 |
| 5,015,330 | 5/1991 | Okumura et al. | 156/643 |
| 5,099,100 | 3/1992 | Bersin et al. | 156/345 X |
| 5,217,560 | 6/1993 | Kurono et al. | 156/345 |

FOREIGN PATENT DOCUMENTS

| | | |
|---|---|---|
| 01-161835 | 6/1989 | Japan . |
| 02-54929 | 2/1990 | Japan . |
| 04-17330 | 1/1992 | Japan . |
| 04-44225 | 2/1992 | Japan . |
| 04-192520 | 7/1992 | Japan . |
| 04-192521 | 7/1992 | Japan . |

*Primary Examiner*—R. Bruce Breneman
*Assistant Examiner*—Jonathan D. Baskin
*Attorney, Agent, or Firm*—Oblon, Spivak, McClelland, Maier, & Neustadt

[57] ABSTRACT

A substrate processing apparatus comprising a process tube for enclosing a plurality of semiconductor wafers, injectors for introducing process gas into the process tube, a vacuum pump for exhausting the process tube, RF electrodes arranged along the outer circumference of the process tube and serving to generate high frequency electric field, when power is supplied, in a process-gas-introduced region so as to make process gas into plasmas, a high frequency power source for supplying power to the RF electrodes, heaters arranged in the process tube to directly heat the plural wafers, a power supply for supplying power to the heaters, and a controller for controlling the amount of power supplied from the power supply to the heaters.

12 Claims, 6 Drawing Sheets

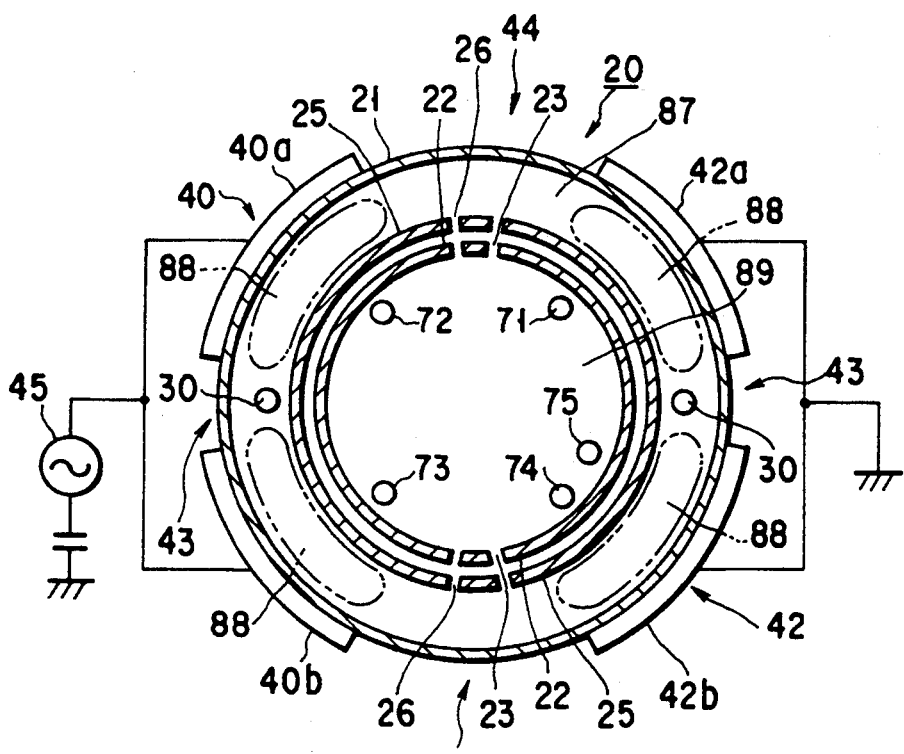
FIG. 4
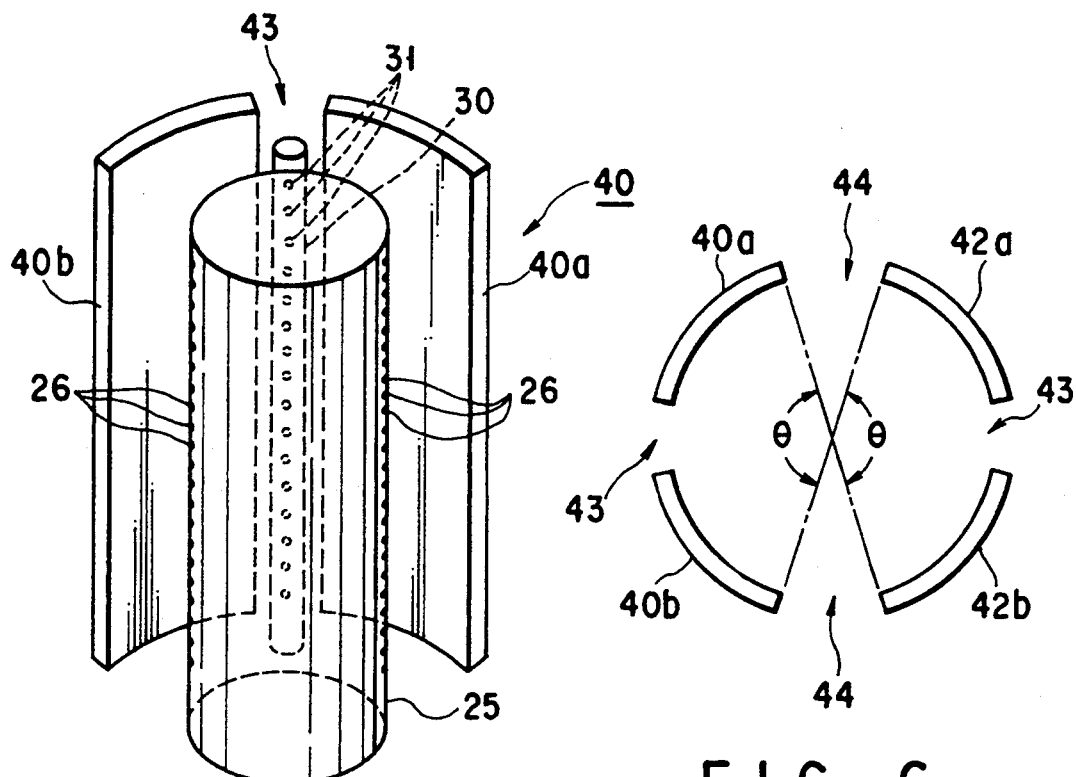
FIG. 5
FIG. 6

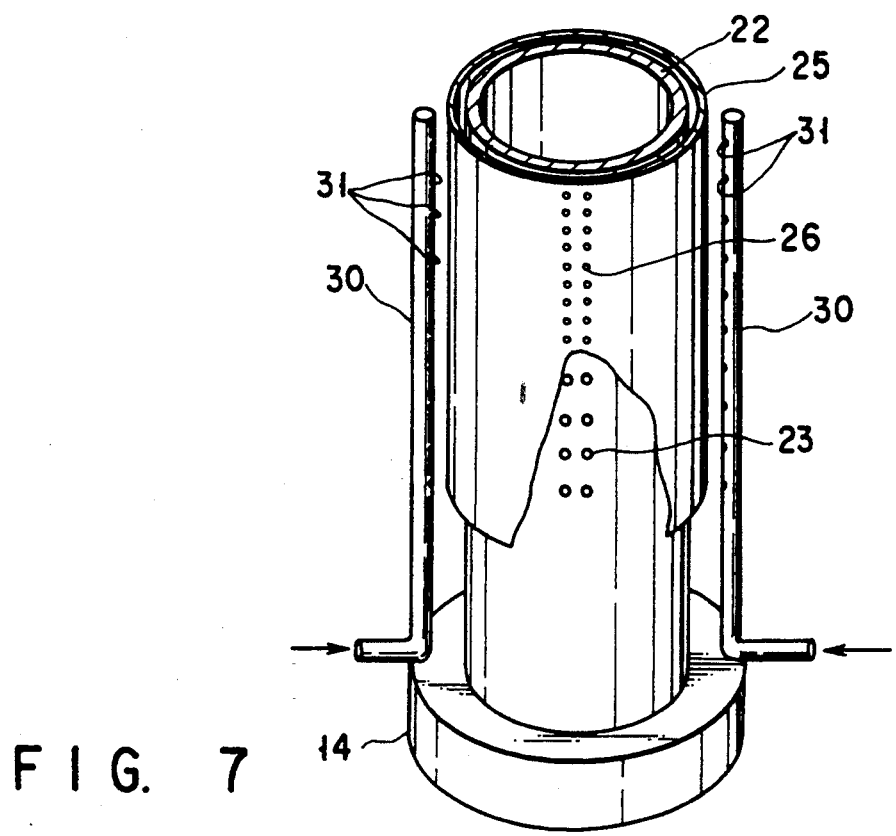
F I G. 7
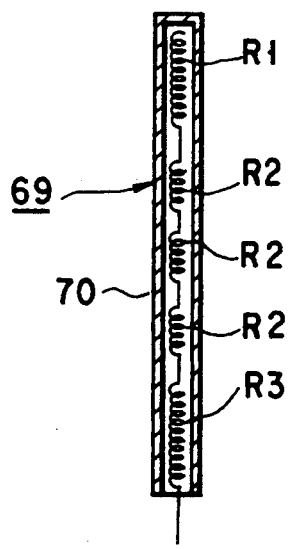
F I G. 8
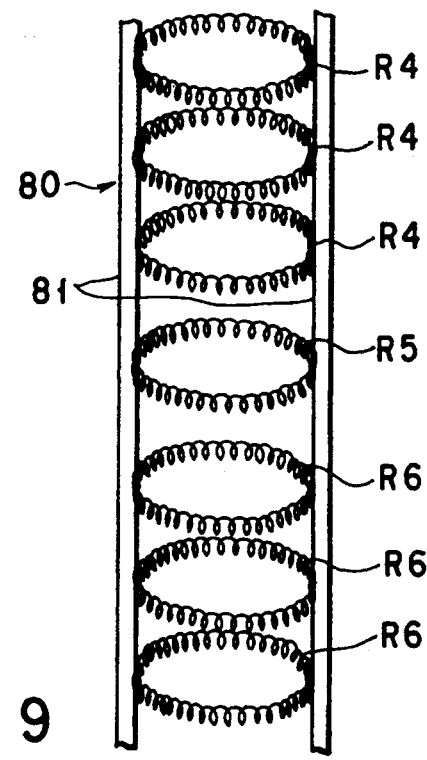
F I G. 9

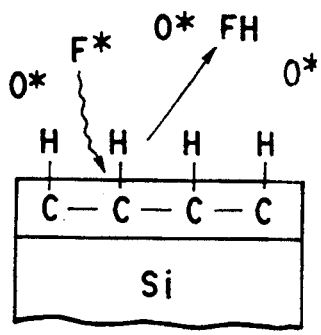
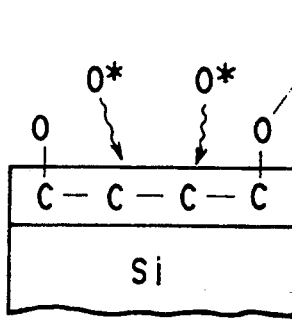
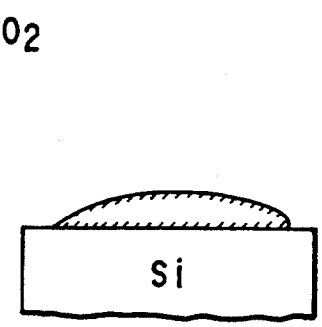
FIG. 11A  FIG. 11B  FIG. 11C
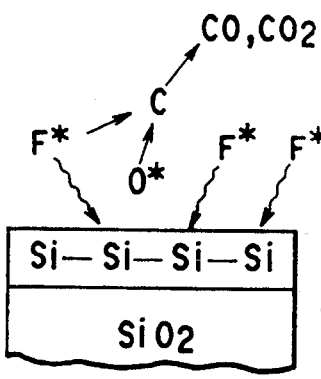
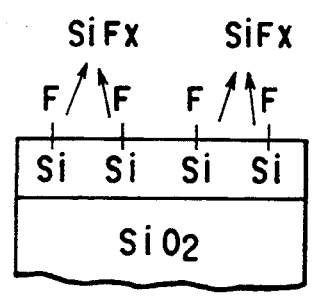
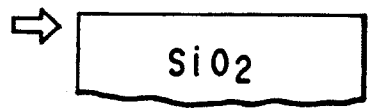
FIG. 12A  FIG. 12B  FIG. 12C
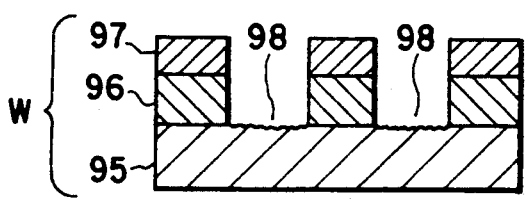
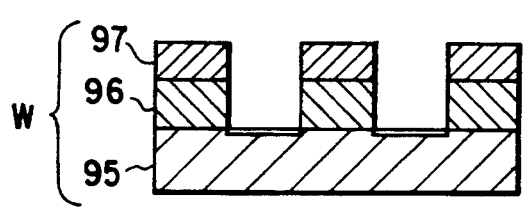
FIG. 13A  FIG. 13B

PLASMA PROCESSING APPARATUS ETCHING TUNNEL-TYPE

BACKGROUND OF THE INVENTION

1. Field of the Invention

The present invention relates to an apparatus for processing substrates such as semiconductor wafers with gas which has been made into plasma.

2. Description of the Related Art

The dry etching and ashing processes are carried out in the course of manufacturing semiconductor devices so as to etch and ash the surface of a substrate while using the reactivity of radicals in plasma. A wafer processing atmosphere is sometimes heated to increase the reactivity of radicals in the dry etching and ashing processes. In the case of the conventional ashing apparatus wherein wafers are individually processed, heaters are embedded in a wafer stage in the vacuum chamber to heat the wafer through the stage.

In the case where a plurality of wafers are to be dry-etched and ashed in the vertical process tube, however, the above-mentioned heater means of the conventional ashing apparatus wherein heaters are embedded in the wafer stage cannot be used because the flow of gas must be made uniform between the wafers.

Japanese Patent Disclosure Sho 62-196820 discloses an apparatus for removing foreign objects such as polysilicon, which become stuck to the inner wall of the process tube by the CVD process applied, from the process tube. According to this apparatus, electrical resistance heaters and a pair of RF electrodes are arranged along the outer circumference of the process tube. Temperature in the process tube is raised by the heaters, etching gas is introduced into the process tube, a high frequency electric field is added to the gas to generate plasma, and radicals are caused to act on the materials stuck to the inner wall of the process tube. As the result, the materials can be removed from a inner wall of the process tube. In the case where the heaters are arranged outside the process tube, however, it takes a long time to raise and lower the temperature in the process tube because the wafer processing atmosphere in the process tube is indirectly heated through the quartz-made wall of the process tube by the heaters.

In the case where an aluminium-made etch tunnel (or plasma shield member) is arranged along the outer circumference of the process tube, it becomes more difficult to quickly heat the wafer processing atmosphere because radiation heat is reflected by the etching tunnel. When the dry etching and ashing processes are to be carried out at high and normal temperatures in the same apparatus, therefore, it takes a long time for the temperature of the wafer processing atmosphere to be made stable. The throughput is thus lowered.

On the other hand, gas which is to be made into plasma is introduced into the apparatus through injectors. Each injector has a plurality of gas jetting holes arranged in the longitudinal direction of the processing tube. The electrical field, therefore, concentrates locally on each of the gas jetting holes to overheats the rim portion of it. The injector is usually made of quartz and there is cleaning into plasma. Therefore, the wafer processing atmosphere is contaminated by these quartz particles thus spread. In addition, the uniformity of process added to the wafers becomes low because the state of plasma is changed in the longitudinal direction of the injector.

Further, holes are formed all over the etching tunnel. A portion of the gas jetted through the injectors flows, as raw gas (or without being made into plasma), into the etching tunnel, passing through those holes of the etching tunnel which are opposite to the injectors and which are adjacent to them. The electric field in the etching tunnel is thus made thin and raw gas cannot be made into plasma in the etching tunnel. The amount of radicals is thus lowered in the wafer processing region. As a result, the etching rate is made so low that it is impossible to effectively process the wafers.

SUMMARY OF THE INVENTION

An object of the present invention is therefore to provide a substrate processing apparatus capable of more quickly heating and cooling substrates in the plasma shield member (or etch tunnel) to increase the throughput of substrates.

Another object of the present invention is to provide a substrate processing apparatus capable of suppressing any local concentration of electric field even when gas jetting pipes (or gas injectors) are arranged in plasma generating regions.

A further object of the present invention is to provide a substrate processing apparatus capable of more efficiently applying isotropic etching and ashing processes to the semiconductor wafers while using radicals.

According to an aspect of the present invention, there can be provided an apparatus for processing substrates with plasma generated by exciting gas comprising a process tube for enclosing a plurality of substrates; means for introducing a process gas into the process tube; means for exhausting the process gas from the process tube; electrode means arranged along the outer circumference of the process tube and serving to generate a high frequency electric field, when power is supplied, in a process-gas-introduced region to make the process gas into plasma; first power supply means for supplying power to the electrode means; heater means arranged in the process tube to directly heat the plural substrates, second power supply means for supplying power to the heater means; and means for controlling the amount of power supplied from the second power supply means to the heater means.

It is preferable that each gas injector (or gas introducing means) is made of $Al_2O_3$ or quartz. $Al_2O_3$ is preferable in this case because material deposited around each gas jetting hole must be removed (or cleaned).

When a high frequency voltage is applied between electrodes and process gas is jetted through process gas jetting pipes, the process gas is caused to flow along the outer circumference of the shield body and enter into those holes of the shield body which are arranged remote from the process gas jetting pipes. Discharge regions (or strong electric fields) are formed between each process gas jetting pipe and the holes of the shield body. All or almost all of the process gas is thus made into plasma before it is introduced into the holes of the shield body, and a larger amount of active materials can be therefore introduced into the shield body. When an inner cylinder is arranged inside the shield body and gas flowing holes are formed in the inner cylinder, radicals will not be deactivated and all caused to flow into the wafer processing region to more efficiently plasma-process the wafers.

The electrode is divided in half in the circumferential direction of the process tube. The electric field is thus thinner in that region which is opposed to a clearance formed between the two electrode members. The concentration of electric field on each gas jetting hole of the gas jetting pipe can be thus made lower not to locally heat any of the gas jetting pipes. In addition, the state of plasma can be made more uniform in the longitudinal direction of the gas jetting pipes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a horizontally-sectioned view showing the plasma etching/ashing apparatus;

FIG. 5 is a perspective view showing how RF electrodes, a plasma shield member (or etch tunnel) and a gas injector are positioned relative to one another;

FIG. 6 is a layout showing an assembly of RF electrodes viewed in the longitudinal axis direction of the apparatus;

FIG. 7 is a perspective view showing how the shield body and the gas injectors are positioned relative to one another;

FIG. 8 is a vertically-sectioned view showing a heater means in another embodiment of the present invention;

FIG. 9 is a perspective view showing a heater means in a further embodiment of the present invention;

FIGS. 11A through 11C are models intended to explain the isotropic etching process applied to the silicon wafer;

FIGS. 12A through 12C are models intended to explain the ashing process applied to the silicon wafer; and FIGS. 13A and 13B are sectional views showing a part of the silicon wafer enlarged.

DETAILED DESCRIPTION OF THE PREFERRED EMBODIMENTS

Some embodiments of the present invention will be described in detail with reference to the accompanying drawings.

Figure 1:
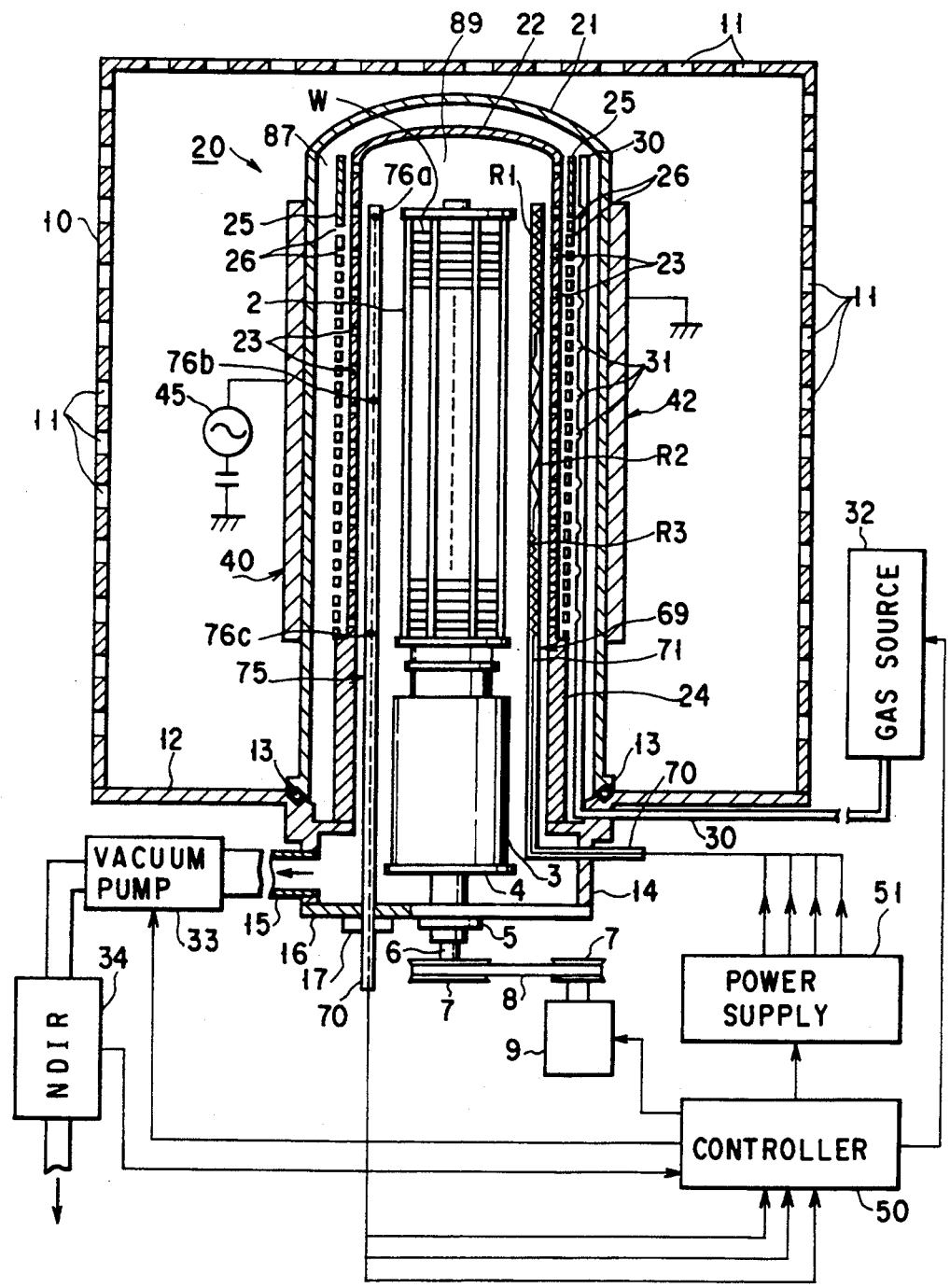
FIG. 1 is a block diagram showing the main part of a plasma etching/ashing apparatus, which serves as the substrate processing apparatus, partly cut out.

As shown in FIG. 1, the main portion of a dry etching/ashing apparatus 20 is arranged in a box body 10, which is made by a punched metal, having a plurality of holes 11. The process tube made of quartz comprises outer and inner cylinders 21 and 22 which are arranged substantially coaxial to each other. A manifold 14 made of stainless steel is arranged under the outer and inner cylinders 21 and 22. An exhaust passage 15 extends from a side of the manifold 14 and the inner cylinder 22 is exhausted through the exhaust passage 15 by a vacuum pump 33. The outer cylinder 21 is connected to a bottom 12 of the box body 10 through an O-ring 13 and thus kept air-tight.

Figures 2, 3:
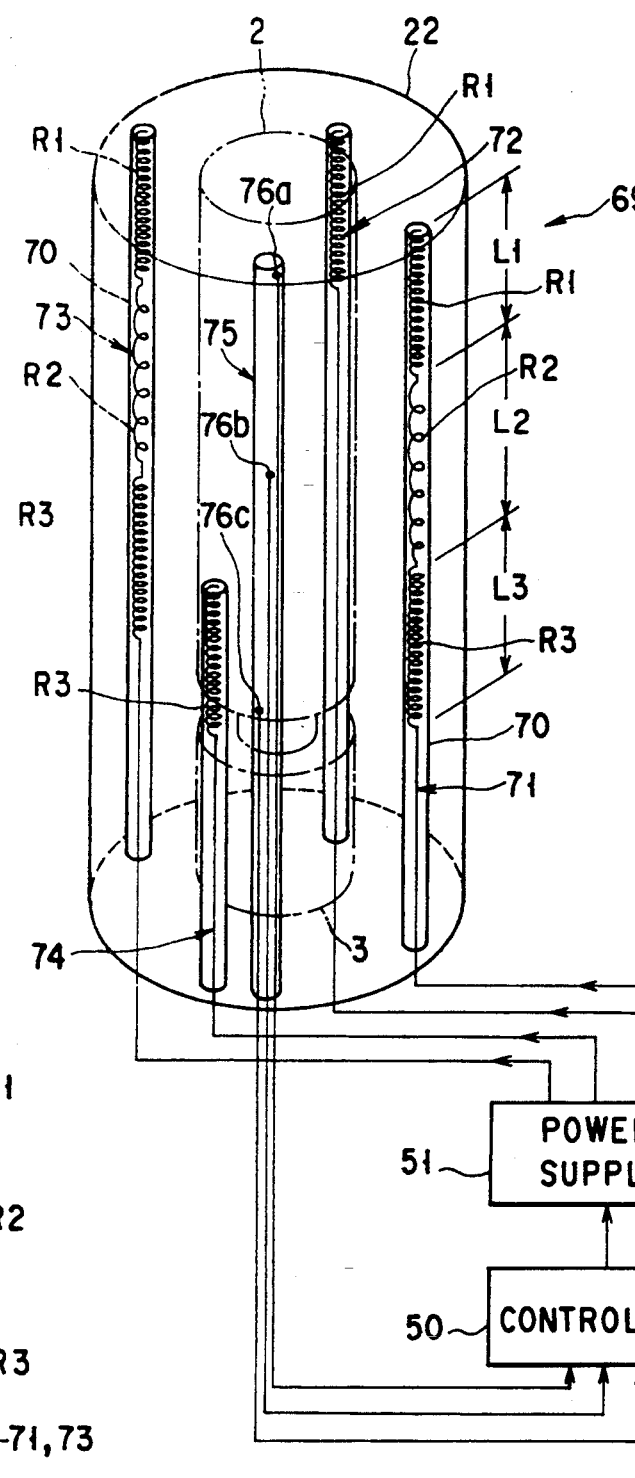
FIG. 2 is a block diagram showing heater and temperature detector means.
FIG. 3 is a view showing a heater element and its temperature distribution when power is applied to it.

As shown in FIG. 2, heater and temperature detector means 69 and 75 are arranged in the inner cylinder 22. The heater means 69 is arranged along a wafer boat 2 to directly heat wafers W. It includes four-type resistant heating coil elements 71, 72, 73 and 74. Each of these elements 71, 72, 73 and 74 is made of Kanthal alloy of the Fe-Cr-Co-Al system and it is housed in a protection pipe 70 which has an outer diameter of 17 mm. The protection pipe 70 is made of SiC, quartz or $Al_2O_3$. The resistant heating coil elements 71, 72, 73 and 74 are connected to a power supply 51 and they are controlled independently of the others by controller 50 when power is supplied to them. Each of the first and third elements 71 and 73 has three coil portions $R_1$, $R_2$ and $R_3$. The second element 72 has only a coil portion $R_1$ and the fourth element 74 has only a coil portion $R_3$. The coil portion $R_1$ is positioned at an upper zone in the process tube, the coil portion $R_2$ at an intermediate zone in the process tube, and the coil portion $R_3$ at a lower zone in the process tube. The coil portions $R_1$, $R_2$ and $R_3$ have lengths $L_1$, $L_2$ and $L_3$. Each of the coil portions $R_1$ and $R_3$ has a short coil pitch but the coil portion $R_2$ has a long coil pitch. Each of lengths $L_1$ and $L_3$ is 145 mm and length $L_2$ is 60 mm. Each of lengths $L_1$ and $L_3$ may be 100 mm.

When power is supplied to the element 71 or 73 and its coil portions $R_1$, $R_2$ and $R_3$ are thus heated, temperature distributions TG1, TG2 and TG3 are caused as shown in FIG. 3. When they are combined together, a total temperature distribution TG4 is obtained flat, a indicating telling that the entire wafer processing atmosphere (or a region 89) can be made substantially uniform in temperature.

The temperature detector means 75 has three-type thermocouples connected to the input side of the controller 50. These three-type thermocouples are housed in the protection pipe 70. A detecting portion 76a of the first thermocouple is positioned at the upper zone in the process tube, a detecting portion 76b of the second thermocouple at the intermediate zone in the process tube and a detecting portion 76c of the third thermocouple at the lower zone in the process tube.

As shown in FIG. 8, the second coil portion $R_2$ may be made plural. It may also be arranged, as shown in FIG. 9, that ring-shaped coil portions $R_4$, $R_5$ and $R_6$ are supported by supports 81 to heat the wafers W on the boat 2. The coil pitch of each of upper and lower coil portions $R_4$ and $R_6$ may be made smaller than that of the intermediate coil portion $R_5$ to have a larger heat value in this case.

As shown in FIGS. 1 and 4, an etch tunnel 25 is coaxially arranged between the outer cylinder 21 and the inner cylinder 22. It is provided with a plurality of holes 26 and its lower end portion is fixed to the inner cylinder 22. It is made of aluminium, but graphite, silicon oxide and silicon carbide (SIC) can be used as its material.

Two gas injectors 30 are arranged in a region 87 between the etching tunnel 25 and the outer cylinder 21. Each gas injector 30 is communicated with a gas supply source 32, passing through the manifold 14. The gas supply source 32 has plural bombs (not shown) and flow rate control valves. $CF_4$ gas or oxygen gas which serves as etching gas is contained in each bomb. $CF_4$ and oxygen gases are mixed at an appropriate rate and then supplied to the injectors 30.

As shown in FIG. 5, each gas injector 30 is located in a space 43 between the electrodes, directing its plural jet openings 31 to the etching tunnel 25.

As shown in FIG. 7, the holes 26 of the etching tunnel 25 are shifted from each gas injector 30 by 90 degrees and the holes 23 of the inner cylinder 22 are also shifted from each gas injector 30 by 90 degrees. Each gas injector 30 is made preferably of alumina ($Al_2O_3$) or quartz, and more preferably of alumina. This is because alumina is higher in corrosion-resistance, lower in the rate of its being etched and longer in life.

A non-reversible infrared detector (NDIR) 34 and a harmful component remover (not shown) are arranged downstream of the vacuum pump 33. The NDIR 34 serves to detect infrared absorption spectrum in gas exhausted and to send a signal to the controller 50 so as to terminate the etching/ashing process. The harmful component remover serves to remove harmful components from gas exhausted and then discharge the gas outside.

The bottom opening of the manifold 14 is closed by a cap 16 made of stainless steel. The cap 16 is supported, movable up and down together with the wafer boat 2, by an elevator mechanism (not shown). A vertical shaft 6 is passed through the cap 16 with a seal mechanism 5 interposed between them and this shaft 6 is rotated by a rotary mechanism, which has a pair of pulleys 7, a belt 8 and a motor 9. The motor 9 is controlled by the controller 50.

A turntable 4 is fixed to the top of the shaft 6. A heat insulating sleeve 3 made of quartz is mounted on the top of the turntable 4 and the wafer boat 2 is then mounted on the heat insulating sleeve 3. 25 or 50 sheets of 8-inch semiconductor wafers are housed in the wafer boat 2. The pitch interval between the adjacent two wafers in the boat 2 is 4.76 mm. The boat 2 is designed to support each of the wafers in it at four points along the outer rim of the wafer. While being controlled by the controller 50, the elevator mechanism (not shown) carries the boat 2 into and out of the inner cylinder 22 and the rotary mechanism (7, 8 and 9) rotates the boat 2 in the inner cylinder 22.

As shown in FIG. 4, a pair of electrodes 40 and 42 are pressed against the outer circumference of the outer cylinder 21 by pressing means (not shown). The electrodes 40 and 42 are detachable from the outer cylinder 21. One electrode 40 is connected to an RF power source 45 while the other 42 is grounded. High frequency voltage having a frequency of 13.56 MHz and a power of 2 KW can be applied from the RF power source 45 to between the electrodes 40 and 42.

As shown in FIG. 6, the electrode 40 comprises a set of electrode members 40a and 40b separated from each other, and the other electrode 42 also comprises a set of electrode members 42a and 42b separated from each other. An interval 44 between the electrode members 40a (40b) and 42a (42b) is made fully wider than an interval 43 between the electrode members 40a (40b) and 40b (42b). The interval 43, however, is a distance long enough to keep the electrode members 40a (42a) and 40b (42b) remote from the gas injector 30. The electrode members 40a, 40b, 42a and 42b are positioned in such a way that each crossing angle $\theta$ shown in FIG. 6 becomes 135 degrees.

As shown in FIGS. 4 and 7, two lines of the holes 23 are formed in the inner cylinder 22 along the longitudinal direction thereof, opposing the other two lines of the holes 23. Two lines of the holes 26 are also formed in the etching tunnel 25 along the longitudinal direction thereof, opposing the other two lines of the holes 26. The pitch between the adjacent two holes 23 is same as that of the adjacent two holes 26 and the lines of the holes 23 are located adjacent to those of the holes 26. Each hole 23 has a diameter of 2–3 mm and each hole 26 has a diameter of 1–2 mm.

When a pressure difference between a region outside the etching tunnel 25 and inside the inner cylinder 22 becomes too large (or holes 23 and 26 are too small in size), radicals cannot be effectively introduced into the inner cylinder 22 which thereby lowers the etching rate. When this pressure difference becomes too small (or holes 23 and 26 are too large in size), however, a large amount of radicals can be introduced into the inner cylinder 22 but it becomes difficult to introduce them to the center portion of the wafer W. As a result, the etching rate becomes high at the outer rim portion of the wafer W but low in the center portion thereof, thereby lowering the etching uniformity all over the wafer. When the holes 23 and 26 have the above-mentioned diameters, therefore, the pressure difference should be approximately 0.5 Torr, thereby enabling the wafer W to be etched with a higher uniformity and at a higher rate.

An example of the dry etching/ashing process achieved by the above-described apparatus will be described referring to FIGS. 10a through 10C.

Figure 10A:
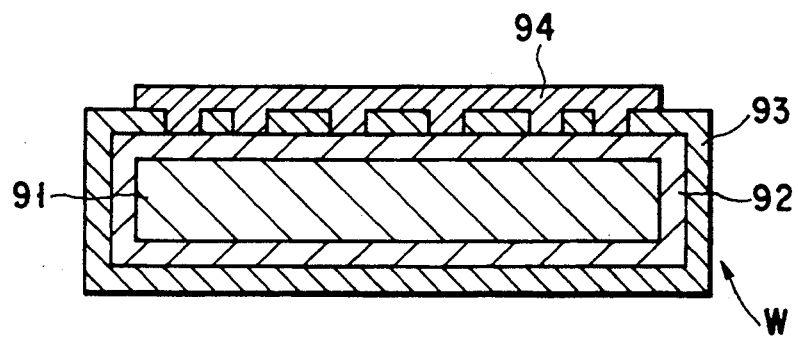
FIGS. 10A through 10C are sectional views schematically showing sections of a silicon wafer.

As shown in FIG. 10A, the wafer W to be processed comprises coating the whole surface (or top and bottom surfaces and end face) of a silicon substrate 91 with silicon oxide film 92 and then with polysilicon film 93. The silicon oxide film 92 is about 1000 Angstrom thick and the polysilicon film 93 about 4000 Angstrom thick. A pattern is formed in the polysilicon film 93 on the top of the wafer W. The entire pattern-formed top surface of the wafer W is further covered with resist film 94 of the novolac group. This resist film 94 is provided to protect the pattern-formed top of the wafer W and its film thickness is in a range of 13000–18000 Angstrom.

The boat 2 in which 66 sheets of these silicon wafers W are contained is loaded into the inner cylinder 22 by a boat carrying mechanism (not shown). The inner cylinder 22 is exhausted to have an internal pressure of $1 \times 10^{-3}$ Torr. While rotating the wafer boat 2 at a predetermined speed, process gas is introduced into the region 87 through holes 31 of the injectors 30. The process gas is a mixture of $CF_4$ and oxygen ($O_2$) gases mixed at a flow rate of $CF_4/O_2 = 11/3$.

The inner cylinder 22 is exhausted to an internal pressure of 0.2 Torr. High frequency voltage having a power of 2 KW and a frequency of 13.56 MHz is applied between the electrodes 40 and 42 to supply an electric field to the gas in the region 87. As shown in FIG. 4, gas plasmas 88 are generated in the region 87 and adjacent to the electrodes 40a, 40b, 42a and 42b. They spread in the region 87 and become uniform in plasma density. When they reach holes 26 of the etching tunnel 25, only fluorine and oxygen radicals in them pass through the holes 26. These radicals further enter into the inner cylinder 22 (or region 87) through the holes 23 to act on the polysilicon film 93 on the bottom and end faces of the wafer W.

Figure 10B:
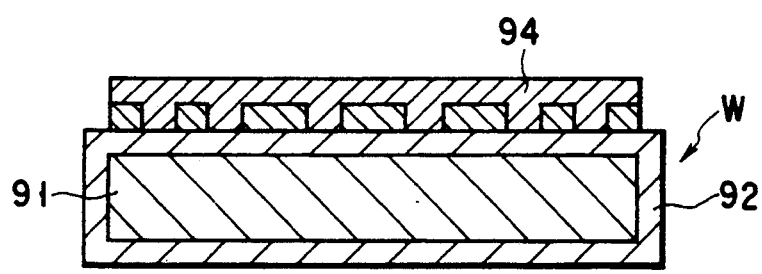
Figure 10C:
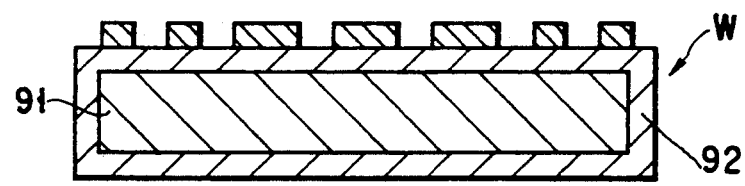

As shown in FIG. 10B, when the polysilicon film 93 is etched for about 20 minutes by the radicals, it can be removed from the bottom and end faces of the wafer W. The NDIR 34 serves as an end point monitor to detect the end of the etching process and control the etching time.

When the bottom face of the wafer W is etched in this manner, the ashing process is then applied to the resist film 94 on the top of the wafer W. This ashing process is carried out under such conditions that the flow rate of $CF_4$ and oxygen gases (or $CF_4/O_2$) is set equal to 1/7-1/5 and that the region 89 is heated to a temperature lower than 200° C. by the heater means 69. The resist film 94 is thus removed from the top of the wafer W, as shown in FIG. 10C. The end point of the ashing process is detected by the NDIR 34 to control the ashing time.

Referring to FIGS. 11A-11C and 12A-12C, it will be described how the etching and ashing processes are achieved.

In the case where the polysilicon film 93 is to be etched, F radicals decomposed from $CF_4$ contribute directly to the etching of the polysilicon film 93, as shown in FIGS. 11A-11C. Carbon generated when $CF_4$ is decomposed are unnecessary for this etching and O radicals are used to make these Carbon into oxides such as CO and $CO_2$. F radicals are thus caused to effectively react with H groups of the polysilicon film 93 to thereby increase the etching rate. The surface of the resist film 94 is fluorinated by F radicals during the etching of the polysilicon film 93. Therefore, the resist film 94 is thus left an ashed. It has been confirmed by tests that the etching rate becomes maximum or 200 Angstrom/min when $CF_4/O_2=11/3$ and the internal pressure is about 0.2 Torr.

In the case where the resist film 94 is to be ashed, F radicals are generated together with O radicals when the mixture of $CF_4$ and oxygen gases is made into plasma. The flow rate of $CF_4$, however, is much smaller, as compared with the etching case. Therefore, as shown in FIGS. 12A-12C, F radicals which have reached the surface of the resist film 94 loosen the connection of C-H and then extract H from this connection. C groups of the resist film 94 from which H have been extracted are thus caused to more easily react with O radicals. The wafer processing region 89 is heated this time to the temperature lower than 200° C. by the heater means 69. The resist film 94 can be thus ashed at a higher rate. The resist film 94, 1.5 um thick, for example, can be ashed for 20-25 minutes.

Referring to FIGS. 13A and 13B, it will be described how the isotropic etching/ashing process is applied to the pattern-formed surface of the silicon wafer W.

Silicon oxide film 96 is patterned on polysilicon film 95 of the wafer W. Resist film 97 is further formed on a the silicon oxide film 96. That face of the polysilicon film 95 which is exposed at each etched portion 98 is uneven when viewed on microscopic scale. In short, each etched portion 98 is damaged by the impact of directional ions at the etching time.

The wafer boat 2 in which 25 or 50 sheets of these wafers W are housed is loaded into the inner cylinder 22. The inner cylinder 22 is exhausted and etching gas is then introduced into the region 87 through the injectors 30. The etching gas is a mixture of $CF_4$ and oxygen gases. The exhausting of the inner cylinder 22 is controlled to set the internal pressure to a predetermined value. Gas plasmas are caused in the region 87 under this state.

Fluorine and oxygen radicals pass through holes 26 of the etching tunnel and then enter into the region 89, passing through holes 23 of the inner cylinder 22. The damaged portions 98 of the polysilicon film 95 are isotropically etched by these radicals and thus removed from the polysilicon film 95, as shown in FIG. 13B. The above-mentioned mixed gas is then introduced into the region 87 to generate gas plasma so as to ash the resist film 97.

According to the above-described apparatus, the heater means 69 is arranged in the inner cylinder 22 to directly heat the wafers W and their surroundings. This enables the wafer processing region 89 to be heated to the process temperature for a shorter time, thereby increasing the throughput to a greater extent. In addition, the temperature of the wafer processing region 89 can be lowered for a shorter time. This enables the etching process to be more quickly shifted to the ashing process.

Further, heating portions of rod-like heaters have heat values different in the longitudinal direction of the process tube. This enables temperature distribution in the process tube to be made uniform in the longitudinal direction of the tube.

Still further, the wafer boat 2 is rotated in the wafer processing region 89. The temperature of each wafer W can be thus made uniform and the uniformity of the etching/ashing process added to the wafers W and to the surface of each wafer W can be enhanced accordingly.

Still further, each of the heater elements 71-74 is housed in a quartz pipe 70. This prevents heavy metal components of the elements 71-74 from being spread in the region 89 to contaminate the wafers W.

According to the above-described apparatus, the injectors 30 are located in the spaces 43 between electrode members 40a and 40b and between electrode members 42a and 42b. The injectors 30 will therefore be less affected by electric field, and the concentration of electric field on the holes 31 of the injectors can also be reduced. Any local heating of the injectors 30 can be thus suppressed which prevents contaminating materials such as alumina and quartz from being spread in the process tube. In addition, the density of plasma can be made uniform in the longitudinal direction of the injectors 30.

According to the above-described apparatus, holes 26 of the etching tunnel are shifted from injectors 30 in the circumferential direction of the inner cylinder 22 by 90 degrees. Gas introduced, therefore, can move a longer distance in the discharge region 87. This enables process gas to be fully made into plasma. In addition, holes 23 of the inner cylinder 22 are located close to the holes 26 of the etching tunnel. Radicals which have passed through the holes 26 can be therefore less deactivated. As a result, a larger amount of radicals can be introduced into the inner cylinder 22, so that a higher etching rate can be achieved.

The RF electrodes are not limited to the above-described arrangement, and may be arranged in such a way that more sets of paired electrodes each having a shorter arc are located along the outer circumference of the outer cylinder 21. The injector 30 may be single or more than three. It is not necessary that the injector 30 be shifted from the holes 26 of the etching tunnel in the circumferential direction thereof by a quarter, but may be located at any position relative to the holes 26 of the etching tunnel if process gas can be fully made into plasma before it reaches the holes 26 via the injector 30.

LCD and other types of substrates can also be processed by the above-described apparatus.

Additional advantages and modifications will be readily apparent to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for processing substrates with plasma generated by exciting gas comprising:
   a processing tube for housing a plurality of substrates;
   means for introducing a processing gas into the processing tube;
   electrode means arranged along the outer circumference of said processing tube for generating a high frequency electric field, when power is supplied, in a processing gas introducing region to convert said processing gas into plasma;
   heater means arranged immediately adjacent to said plurality of substrates within said processing tube to directly heat said plurality of substrates;
   etching tunnel means arranged between the heater means and the processing gas introducing region and having a plurality of holes through which only radicals in plasma generated in said processing gas introducing region are allowed to pass toward said substrates;
   means for exhausting said processing gas from said processing tube;
   first power supply means for supplying power to said electrode means;
   second power supply means for supplying power to said heater means; and
   control means for controlling the amount of power supplied from said second power supply means to said heater means.

2. The substrate processing apparatus according to claim 1, wherein said processing tube comprises inner and outer cylinders, said substrates and said heater means are located in said inner cylinder, and said processing gas introducing means includes at least one gas injector which is arranged between said inner and outer cylinders, a plurality of holes being formed in said inner cylinder.

3. The substrate processing apparatus according to claim 1, further comprising temperature detector means for detecting the temperature in said processing tube wherein the amount of power supplied to said heater means is controlled by said control means responsive to the temperature detected by said temperature detector means.

4. The substrate processing apparatus according to claim 1, further comprising means for rotating said plurality of substrates in said processing tube.

5. The substrate processing apparatus according to claim 1, wherein said heater means includes resistance heater elements, each having a plurality of portions including heat values which are different at upper, intermediate and lower zones in said processing tube.

6. The substrate processing apparatus according to claim 1, wherein said processing gas introducing means includes gas introducing holes which are located remotely from a plurality of regions where plasma is generated by said electrode means.

7. The substrate processing apparatus according to claim 1, wherein said heater means has a resistance heating element and a protection pipe in which the element is inserted.

8. The substrate processing apparatus according to claim 1, wherein said heater means has resistance heating elements and a plurality of protection pipes for protecting the elements respectively provided in the longitudinal direction of the process tube.

9. An apparatus for processing substrates with plasma generated by exciting gas, comprising:
   a processing tube for housing a plurality of substrates;
   means for introducing a processing gas into said processing tube;
   electrode means arranged along the outer circumference of said processing tube for generating a high frequency electric field, when power is supplied, in a processing gas introducing region to convert the processing gas into plasma;
   heater means arranged immediately adjacent to said plurality substrates in said processing tube to directly heat said substrates;
   etching tunnel means arranged between said heater means and said processing gas introducing region and including a plurality of holes through which only radicals in plasma generated in the processing gas introducing region are allowed to pass toward the substrates;
   means for exhausting said processing gas from said processing tube;
   first power supply means for supplying power to said electrode means;
   second power supply means for supplying power to said heater means; and
   control means for controlling the amount of power supplied from said second power supply means to said heater means,
   wherein said processing gas introducing means includes a gas injector located remotely from regions where plasma is generated by said electrode means and also remotely from said holes included in said etching tunnel means.

10. The substrate processing apparatus according to claim 9, wherein said processing tube comprises inner and outer cylinders, said substrates and said heater means are located within the inner cylinder, and said gas injector is arranged between said inner and outer cylinders, a plurality of holes being formed in said inner cylinder.

11. The substrate processing apparatus according to claim 10, wherein said holes included in said etching tunnel means and said holes formed in the inner cylinder are positioned to face each other with a small distance provided therebetween.

12. The substrate processing apparatus according to claim 11, wherein the holes made in each of said etching tunnel means and said inner cylinder are arranged at the same pitch to form two rows of holes in each.

* * * * *